(12) United States Patent
Bergler et al.

(10) Patent No.: US 6,475,817 B2
(45) Date of Patent: Nov. 5, 2002

(54) METHOD OF FABRICATING INTEGRATED CIRCUITS, PROVIDING IMPROVED SO-CALLED SAW BOWS

(75) Inventors: Ewald Bergler, Weiz (AT); Josef Preishuber-Pfluegl, Graz (AT); Reinhard Fetzer, Halstenbek (DE); Haiko Klepzig, Hamburg (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/908,559

(22) Filed: Jul. 19, 2001

(65) Prior Publication Data

US 2002/0016033 A1 Feb. 7, 2002

(30) Foreign Application Priority Data

Jul. 21, 2000 (EP) .............................. 00890228

(51) Int. Cl.[7] .............................................. H01L 21/66
(52) U.S. Cl. ........................................ 438/17; 438/200
(58) Field of Search ........................ 438/17, 197, 200, 438/14

(56) References Cited

U.S. PATENT DOCUMENTS 4,575,747 A * 3/1986 Fritz ............................ 257/665
4,593,959 A * 6/1986 Simms ......................... 439/75
5,654,646 A * 8/1997 Kit .............................. 324/754
6,129,560 A * 10/2000 Baur ........................... 439/76.1

FOREIGN PATENT DOCUMENTS

DE          4200586 A1     7/1993

* cited by examiner

Primary Examiner—David Nelms
Assistant Examiner—Thao Le
(74) Attorney, Agent, or Firm—Steven R. Biren

(57) ABSTRACT

An integrated circuit (6) has a semiconductor die (47) and an integrated circuit configuration (16) realized on the semiconductor die (47) and situated within bounding faces (52, 53, 54, 55) of the semiconductor die (47), in which two conductor track sections (34, 35) have been provided, which issue from the integrated circuit configuration (16) and which each extend up to a bounding face (55) and which are required for the application of a useful signal (BR1) utilized for test purposes during the fabrication of the integrated circuit (6), and in which an additional conductor track section (41) has been provided, which is disposed adjacent the two conductor track sections (34, 35) and which issues from the integrated circuit configuration (16) and extends toward a bounding surface (55) and preferably up to this bounding face (55) and which serves for the application of a spurious signal (BR2) which interferes with testing.

3 Claims, 1 Drawing Sheet

METHOD OF FABRICATING INTEGRATED CIRCUITS, PROVIDING IMPROVED SO-CALLED SAW BOWS

The invention relates to a method of fabricating integrated circuits, in which during this method an integrated circuit configuration is fabricated on a semiconductor wafer and in which conductor tracks, which are required for test purposes and which can be severed, are fabricated, which tracks each have two conductor track sections which issue from the integrated circuit configuration.

The invention further relates to an integrated circuit having an integrated circuit configuration and including two conductor track sections, which issue from the integrated circuit configuration and which form parts of a conductor track required for test purposes during the fabrication of the integrated circuit and forming a severed conductor track after the fabrication.

A method as defined hereinbefore and an integrated circuit as defined hereinbefore are known from the patent document DE 42 00 586 A1. The known integrated circuit fabricated with the aid of the known method has the problem that in the finished integrated circuit the two conductor track sections, which in the first place constitute portions of a previously severed conductor track, which conductor track is frequently referred to as a saw bow in the technical jargon, and which in the second place issue from the relevant integrated circuit configuration of the integrated circuit, and which in the third place each extend up to a bounding surface of a semiconductor die carrying the integrated circuit configuration, and which in the fourth place are required for the application of a useful signal used for test purposes during the fabrication of the integrated circuit, are simply accessible. An undesired consequence of this simple accessibility is that it is possible to make an electrically conductive connection between the two conductor track sections by means of a conductive material, for example by means of a conductive adhesive or a conductive liquid or a conductive solder joint, as a result of which the conductor track originally required for test purposes, i.e. the so-called saw bow, is afterwards replaced with a substitute electrically conductive connection in an undesirable manner. However, this enables said substitute electrically conductive connection provided as a replacement to be utilized for the application of a useful signal for test purposes. Thus, an unauthorized person can afterwards illegally carry out at least a test operation on an integrated circuit that has been fabricated by the authorized manufacturer of the known integrated circuit and has been deactivated for test purposes, which entails the risk and the possibility that, inter alia, also access is obtained to protected data stored in the integrated circuit, which data should actually be available only during a test operation to be carried out by the authorized manufacturer.

It is an object of the invention to preclude the aforementioned problems and to realize an improved method of fabricating integrated circuits and an improved integrated circuit in a simple and cost-effective manner.

In order to achieve the aforementioned object, characteristic features have been provide in a method in accordance with the invention, in such a way that a method in accordance with the invention may be characterized in the manner defined hereinafter, namely:

A method of fabricating integrated circuits, in which a reticular pattern of separation strips on the semiconductor wafer is defined, and in which a plurality of juxtaposed integrated circuit configurations are formed between the separation strips on the semiconductor wafer, and in which during the fabrication of the integrated circuits at least one conductor track required for test purposes is formed for each integrated circuit, which conductor track has two conductor track sections, which two conductor track sections issue from the relevant integrated circuit configuration and each extend at least into a separation strip and are connected to one another in an electrically conductive manner in the areas of their ends which are remote from the integrated circuit configuration, and which conductor track serves for the application of a useful signal utilized for test purposes, and in which during the fabrication of the integrated circuits for each integrated circuit at least one additional conductor track section is formed adjacent a conductor track section, which additional conductor track section issues from the relevant integrated circuit configuration and extends toward a separation strip and serves for applying a spurious signal which interferes with testing, and in which after the fabrication of the integrated circuits on the semiconductor wafer the semiconductor wafer is partitioned into semiconductor dice along the separation strips, during which the conductor tracks are severed.

Moreover, in order to achieve the aforementioned object, characteristic features have been provide in an integrated circuit in accordance with the invention, in such a way that an integrated circuit in accordance with the invention may be characterized in the manner defined hereinafter, namely:

An integrated circuit having the means defined hereinafter, namely: a semiconductor die, which is bounded by bounding faces, and an integrated circuit configuration realized on the semiconductor die and situated within the bounding faces, in which two conductor track sections have been provided, which two conductor track sections issue from the integrated circuit configuration and each extend up to a bounding face and were required for the application of a useful signal utilized for test purposes during the fabrication of the integrated circuit, and in which at least one additional conductor track section has been provided, which at least one additional conductor track section is disposed adjacent a conductor track section and issues from the integrated circuit configuration and extends toward a bounding surface and serves for the application of a spurious signal which interferes with testing.

The major advantage obtained with a method in accordance with the invention and an integrated circuit in accordance with the invention is that, in the case that in an unauthorized manner the two conductor track sections of the conductor track originally required for test purposes, i.e. the so-called saw bow, are electrically interconnected by means of an electrically conductive material, not only the two conductor track sections of the conductor track originally required for test purposes are electrically interconnected but, in addition, at least one additional conductor track section is electrically connected to the two conductor track sections in the form of a short-circuit. This has the advantage that, in the case of an attempt to carry out an unauthorized test operation via the substitute connection made with the aid of an electrically conductive material, not only the useful signal employed for test purposes but also the spurious signal, which interferes with testing, is applied. As a result of this, an evaluation of the useful signal employed for test purposes is rendered impossible owing to the presence of the interfering spurious signal, which has the advantage that undesired spying out of protected data is precluded.

For the sake of correctness it is to be noted that with an integrated circuit in accordance with the invention it is theoretically also possible to electrically interconnect the conductor track sections, which are in fact required for test purposes, with the aid of a substitute connection, without the additional conductor track sections being included in this electrically conductive substitute connection. However, the effort required in order to realize such an electrically conductive substitute connection is incommensurably greater than the effort required in order to realize such an electrically conductive substitute connection in the case of the integrated circuit known from the patent document DE 42 00 586 A1, as a result of which the fabrication of such an unauthorized substitute connection is now possible almost only in a research laboratory or development laboratory familiar with integration technology, the fabrication of such an unauthorized substitute connection by persons who do not have highly sophisticated equipment at their disposal being no longer possible.

In a method in accordance with the invention and in an integrated circuit in accordance with the invention it has proved to be very advantageous when an additional conductor track section is formed or is present which, together with its adjacent conductor track section, extends up to a bounding surface. Such an embodiment has the great advantage that also in the case that it is attempted to realize a substitute connection in the area of the bounding surface that extends transversely to the semiconductor die of the integrated circuit and in which both the additional conductor track section and the conductor track section adjacent the additional conductor track section, a short-circuit connection is formed between the additional conductor track section and its adjacent conductor track section.

In a method in accordance with the invention and in an integrated circuit in accordance with the invention it has proved to be very advantageous when only one additional conductor track section is formed or is present, which additional conductor track section is situated between the two conductor track sections. This is advantageous in view of a very simple implementation. However, it is to be noted that it is also possible and may be effective to assign an additional conductor track section to each of the two conductor track sections. Furthermore, it is also possible to provide more than one or two additional conductor track sections, i.e. three or more conductor track sections.

The aforementioned aspects as well as further aspects of the invention will be apparent from the examples of embodiments described hereinafter and will be elucidated with the aid of these examples.

The invention will be described in more detail hereinafter with reference to two embodiments which are shown in the drawings by way of example but to which the invention is not limited.

Figure 1:
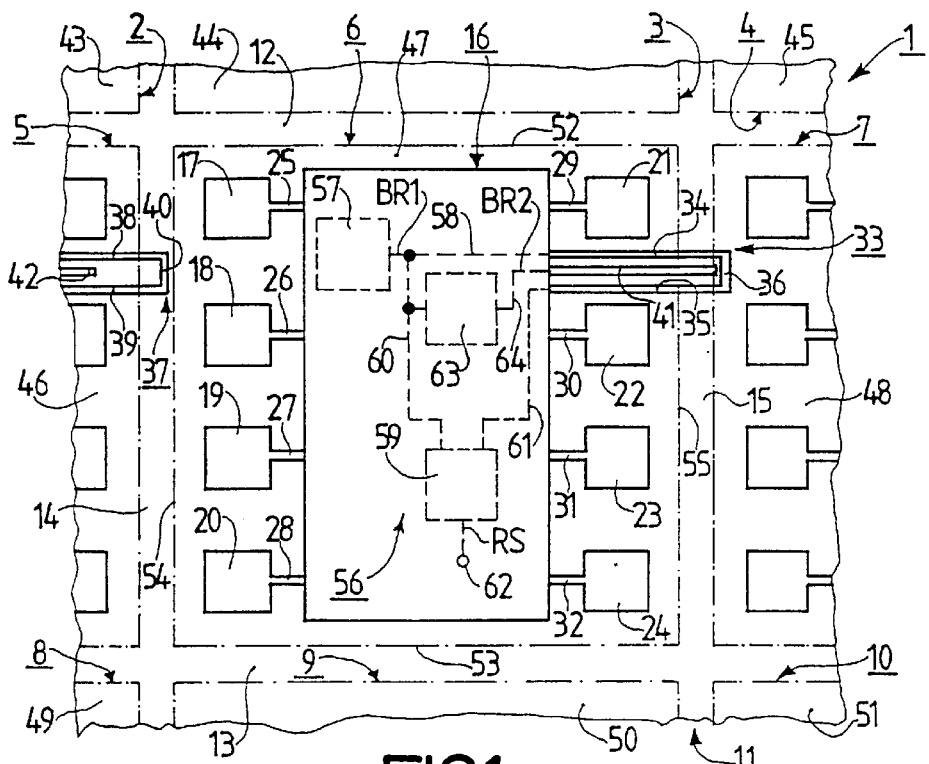
FIG. 1 is plan view of a part of a semiconductor wafer on which integrated circuits in accordance with a first embodiment of the invention have been realized with the aid of a method in accordance with the invention.

FIG. 1 shows only a small part of a semiconductor wafer 1. This semiconductor wafer 1 carries a multitude of integrated circuits, of which in total only eight integrated circuits 2, 3, 4, 5, 7, 8, 9 and 10 are indicated and only one integrated circuit 6 is shown diagrammatically in FIG. 1. In the present case, all the integrated circuits realized on the semiconductor wafer have essentially the same structure.

The fabrication of the integrated circuits realized the semiconductor wafer 1 is effected by means of a method described hereinafter.

In the method of fabricating the integrated circuits a reticular pattern 11 of separation strips is defined on the semiconductor wafer 1, FIG. 1 showing four of these separation strips in total, namely a first separation strip 12, a second separation strip 13, a third separation strip 14 and a fourth separation strip 15. These separation strips are so-called dicing paths, along which dicing paths the semiconductor wafer 1 is sawn into dice after the fabrication of the integrated circuits on the semiconductor wafer 1.

After the pattern of separation strips has been defined, a plurality of adjacent integrated circuit configurations are formed between the separation strips on the semiconductor wafer, only one circuit configuration 16 is shown in FIG. 1. The circuit configuration 16 is a part of the integrated circuit 6. The circuit configuration 16 includes all the active and passive circuit elements of the integrated circuit 6, said circuit elements being realized in integrated circuit technology. Herein, the fabrication of the integrated circuit configurations will not be described in any further detail because it is not relevant in the present context.

During the fabrication of the integrated circuits and integrated circuit configurations contact pads 17, 18, 19, 20, 21, 22, 23 and 24 are realized, as is shown for the integrated circuit 6 in FIG. 1. The contact pads 17, 18, 19, 20, 21, 22, 23 and 24 are each connected to the integrated circuit configuration of the integrated circuit via a short conductor track 25, 26, 27, 28, 29, 30, 31 and 32, respectively, as is shown in FIG. 1 for the integrated circuit configuration 16 of the integrated circuit 6. These contact pads 17 to 24 serve for the connection of bond wires, via which bond wires each integrated circuit can be connected to circuit elements of an electric circuit, which circuit elements are external to the integrated circuit. During the fabrication of the integrated circuits the contact pads 17 to 24 can also be used for carrying out test operations, in which case contact probes of a test device are placed onto at least some of the contact pads 17 to 24, which makes it possible to apply power supply potentials, control signals and test signals via the contact pads 17 to 24 of the integrated circuit to be tested.

During the fabrication of the integrated circuits at least one conductor tracked 33 needed for test purposes is formed for each integrated circuit, i.e. also for the integrated circuit 6. In the present case, the conductor track 33 is required in order to make at least one test operation possible anyhow, i.e. in order to enable at least one test operation.

Such a conductor track has two conductor track sections, which two conductor track sections issue from threshold relevant integrated circuit configuration and each extend at least into a separation strip. In the integrated circuit 6 the first conductor track section 34 and the second conductor track section 35 of the conductor track 33 issue from the integrated circuit configuration 16 and the two conductor track sections 34 and 35 extend not only into the fourth separation strip 15 but they even project slightly beyond the fourth separation strip 15.

The second conductor track section of each integrated circuit, i.e. also the conductor track sections 34 and 35 of the integrated circuit 6 are interconnected in an electrically conductive manner in the areas of their ends which are remote from the integrated circuit configuration, i.e. in the present case from the integrated circuit configuration 16, namely in the present case via a connecting conductor track section which extends transversely, or rather perpendicularly, to the two conductor track sections 34 and 35.

The conductor track 33, which is thus formed with the aid of the two conductor track sections 34 and 35 and with the aid of the connecting conductor track section 36, serves for the application of a useful signal utilized for test purposes.

In this respect, it is to be noted that the two conductor track sections of an integrated circuit need not necessarily extend beyond a separation strip but that it is quite possible, as is shown for the integrated circuit 5 in FIG. 1, that a conductor track 37 has two conductor track sections 38 and 39 whose ends that are remote from the integrated circuit configuration included in the integrated device 5 reach exactly into the third separation strip 14, in which case the connecting conductor track section 40, which electrically interconnects the two conductor track sections 38 and 39, is also situated in the third separation strip.

In the described method of fabricating the integrated circuits it is advantageous that in the course of the fabrication of the integrated circuits an additional conductor track section is formed for each integrated circuit, which additional conductor track section is situated adjacent a conductor track section, in the present case even to the two conductor track sections. In the present case, only one additional conductor track section is formed, which is arranged between the two conductor track sections of a conductor track, as is illustrated by the additional conductor track sections 41 and 42 and the two conductor track sections 34, 35 and 38, 39 of the two conductor tracks 33 and 37 in FIG. 1.

Each additional conductor track section issues from the relevant integrated circuit configuration and extends toward a separation strip. One additional conductor track section 41 issues from the integrated circuit configuration 16 and extends toward the fourth separation strip 14. In the present case, the additional conductor track section 41 advantageously ends slightly beyond the fourth separation strip 15. However, the additional conductor track section 41 may alternatively be shorter, in which case it may extend into the fourth separation strip 15 or may even end before the fourth separation strip 15. This applies likewise to the other additional conductor track section 42, which is shorter than the additional conductor track section 41.

The additional conductor track section of each integrated circuit, i.e. also each of the two additional conductor track sections 41 and 42 of the integrated circuits 6 and 5, serves to apply a spurious signal, which interferes with testing.

After fabrication of the integrated circuits on the semiconductor wafer, as described above, a test operation is performed on each integrated circuit. During this test operation a useful signal utilized for testing is applied via the conductor tracks, i.e. also via the conductor tracks 33 and 34, which is customary measure known per se since long. In the present case, this useful signal serves to enable the actual test operations.

After fabrication of the integrated circuits on the semiconductor wafer, as described hereinbefore and after the required test operations mentioned above have been carried out the semiconductor wafer 1 is divided into semiconductor dice along the separation strips. This division, which is effected by means of sawing operations, is performed along all the separation strips, i.e. also along the separation strips 12, 13, 14 and 15 shown in FIG. 1. During this division of the semiconductor wafer 1 into separate semiconductor dice the conductor tracks are severed, i.e. also the conductor tracks 33 and 37 shown in FIG. 1, and at least a part of the additional conductor tracks is cut off, namely the additional conductor track 41 shown in FIG. 1. Of said semiconductor dice a total number of nine semiconductor dice 43, 44, 45, 46, 47, 48, 49, 50 and 51 are shown in FIG. 1, namely by means of dash-dot lines.

After completion of the process described above a multitude of integrated circuits are obtained, such as inter alia the integrated circuit 6. The structure of all the integrated circuits will now be explained briefly with reference to the integrated circuit 6.

The integrated circuit 6 comprises the semiconductor die 47, which is bounded by four bounding faces 52, 53, 54 and 55, which similarly to the separation strips 12, 13, 14 and 15 are shown in dash-dot lines in FIG. 1. The integrated circuit 6 comprises the integrated circuit configuration 16 realized on the semiconductor die 47 and situated within the bounding faces 52, 53, 54 and 55.

The integrated circuit 6 further includes the two conductor track sections 34 and 35, though no longer with the original overall lengths. The two conductor track sections 34 and 35 issue from the integrated circuit configuration 16 and extend up to the fourth bounding face 55. During the fabrication of the integrated circuit 6 the two conductor track sections 34 and 35 were required for the application of a useful signal utilized for test purposes, as described hereinbefore.

Furthermore, the integrated circuit 6 includes the additional conductor track section 41, though no longer with the original overall length. The additional conductor track section 41 is disposed adjacent the two conductor track sections 34 and 35 and extends from the integrated circuit configuration 16 toward the fourth bounding face 55. In the present case, the integrated circuit 6 has only one, i.e. the additional conductor track section 41, which is arranged between the two conductor track sections 34 and 35. The additional conductor track section 41 serves for the application of a spurious signal which interferes with testing.

Here, it is to be noted that the additional conductor track section 41 need not necessarily arranged between the two conductor track sections 34 and 35 but may also be disposed outside the area between the two conductor track sections 34 and 35 and may then be arranged adjacent one of the two conductor track sections 34 and 35. It is then important that the additional conductor track section 41 lies as close as possible to one of the two conductor track sections 34 and 35. In practice, the distance between the additional conductor track section 41 and the adjacent conductor track section 34 and/or 35 is only a few micrometers. The widths of the additional conductor track section 41 and the two conductor track sections 34 and 35 are well below 1 $\mu$m. Furthermore, it is to be noted that not just one additional conductor track section 41 may be provided but that it is also possible to provide two or more additional conductor track sections.

Hereinafter, a part 56 of the circuit arrangement of the integrated circuit 6, which arrangement is formed with the aid of the integrated circuit configuration 16, will be described briefly in some more detail.

The part 56 includes a signal generator 57, which in the present case is adapted to generate and supply a signal BR1 representing a given bit string, which given bit string is basically a random bit string, referred to hereinafter as a non-inverted bit string, which is purely for reasons of verbal distinction. The signal BR1, which can be generated with the aid of the signal generator 57 and which represents the non-inverted bit string, can be applied via a first electrically conductive connection 58.

The part 56 further includes a comparator 59. The signal BR1, which can be generated with the aid of the signal generator 57 and which represents the non-inverted bit string, can be applied directly from the signal generator 57 to the comparator 59 via a second electrically conductive connection 60. Moreover, via a third electrically conductive connection 61 connected to the second conductor track section 35, the signal BR1, which can be generated with the aid of the signal generator 57 and which represents the non-inverted bit string, can be applied indirectly to the comparator 59 via the conductor track 33, i.e. via the first conductor track section 34, the connecting conductor track section 36 and the second conductor track section 35. As long as the two applied signals BR1, which each represent the non-inverted bit string, are equal to one another, the comparator 59 supplies an enable signal RS to a circuit point 62, as a result of which further test operations or test processes inside the integrated circuit 6 are enabled and can thus be carried out.

The part 56 further includes an inverter stage 63. The signal BR1, which can be generated with the aid of the signal generator 57 and which represents the non-inverted bit string, can be applied directly to from the output of the signal generator 57 to the inverter stage 63. The inverter stage 63 inverts the signal BR1, which is applied to this stage and which represents the non-inverted bit string, as a result of which the inverter stage 63 supplies a signal BR2, which represents an inverted bit string, to a fourth electrically conductive connection 64. The fourth electrically conductive connection 64 leads to the additional conductor track section 41, as a result of which the signal BR2, which represents the inverted bit string, appears on the additional conductor track section 41 and can be transferred via the additional conductor track section 41 under given conditions, namely as a spurious signal that interferes with testing.

The finished integrated circuit 6 includes the two conductor track sections 34 and 35, which reach up to the fourth bounding face 55, as well as the additional conductor track section 41. These three conductor track sections 34, 35 and 41 are freely accessible in the finished integrated circuit 6 but they may also be covered with a plastic cover, which does not really preclude a comparatively easy access to these three conductor track sections 34, 35 and 41. Expressed in other terms, this means that the two conductor track sections 34 and 35 are readily accessible and can thus readily be interconnected in an electrically conductive fashion, with the aid of an electrically conductive material, for example a solder or an electrically conductive paste or an electrically conductive gel, so as to realize a substitute connection for the connecting conductor track section 36 originally present between the two conductor track sections 34 and 35. The electrically conductive material can be applied in that area of the main surface of the semiconductor die 47 where the conductor track sections 34 and 35 are located but likewise in the area of the bounding face 55, which extends perpendicularly to this main surface.

When such an electrically conductive material is applied to the conductor track sections 34, 35 and 41 of the integrated circuit 6, if required after uncovering of these conductor track sections 34, 35 and 41, this results in the formation of not only an electrically conductive substitute connection between the two conductor track sections 34 and 35 but, owing to the particularly small distances of these conductor track sections 34, 35 and 41 from one another, also an electrically conductive connection which produces an electrical short-circuit between the two conductor track sections 34 and 35 and the additional conductor track section 41. In the case of an attempt to perform an unauthorized test operation, this results in the comparator 59 receiving not only the signal BR1, which is generated with the aid of the signal generator 57 and which represents the non-inverted bit string and which is applied to the first conductor track section 34 via a first electrically conductive connection 58, but also the signal BR2, which is inverted with the aid of the inverter stage 63 and which represents the inverted bit string and which is applied to the additional conductor track section 41 via the fourth electrically conductive connection 64, via the second conductor track section 35 and the third electrically conductive connection 61, as a result of which the comparator 59 receives two mutually different signals BR1 and BR2 and consequently does not produce a positive comparison result and the comparator 59 therefore does not supply an enable signal RS to the circuit point 62. As a consequence, one or more subsequent test operations or test sequences to be enabled with the aid of the enable signal RS cannot be activated as a result of the absence of the enable signal RS. This precludes in a simple manner that an impermissible and undesired detection of possibly secret data stored in the integrated circuit 6 can be effected through an unauthorized activation of test operations or test sequences.

Figure 2:
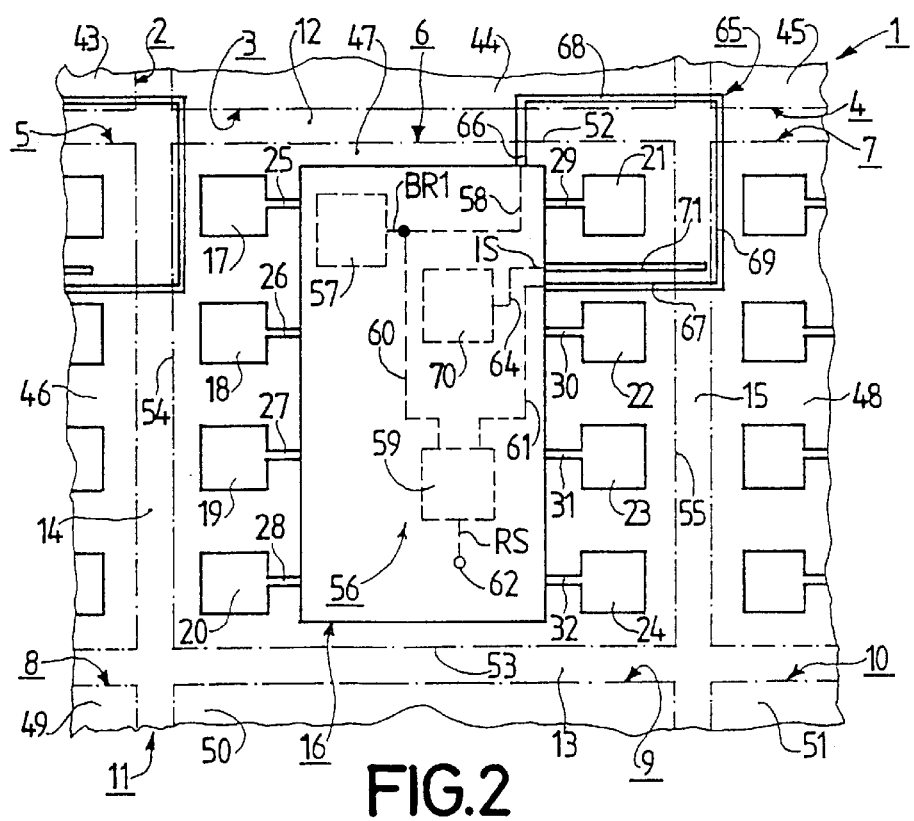
FIG. 2 shows, in a manner similar to FIG. 1, a part of a semiconductor wafer on which integrated circuits in accordance with a second embodiment of the invention have been realized with the aid of a method in accordance with the invention.

FIG. 2 shows an embodiment which is a modification of the embodiment shown in FIG. 1. The integrated circuit 6, which is shown beside other integrated circuits 2, 3, 4, 5, 7, 8, 9 and 10 in FIG. 2, includes a conductor track 65 having a first conductor track section 66 and a second conductor track section 67, which first conductor track section 66 extends beyond the first separation strip 12 and which second conductor track section 67 extends beyond the fourth separation strip 15. In the present case, the first conductor track section 66 thus extends toward the first bounding face 52, while the other conductor track section 67 extends toward the fourth bounding face 55. The two conductor track sections 66 and 67 are interconnected in an electrically conductive manner with the aid of two connecting conductor track sections 68 and 69, the two connecting conductor track sections 68 and 69 being connected directly to one another in an electrically conductive manner.

The integrated circuit 6 shown in FIG. 2 includes a separate further signal generator 70 instead of an inverter stage 63, which further signal generator can generate a spurious signal IS, which interferes with testing and which can be applied to an additional conductor track section 71 via the fourth electrically conductive connection 64.

When the two conductor track sections 66 and 67 in the integrated circuit 6 shown in FIG. 2 are connected in an electrically conductive manner by a substitute connection realized with the aid of a electrically conductive material, this also results in a short-circuit between the additional conductor track section 71 and at least the second conductor track section 67, so that the comparator 59 does not generate an enable signal RS.

In the integrated circuit 6 shown in FIG. 1 the conductor track 33 is U-shaped. This need not be so because such a conductor track may alternatively be wedge-shaped, in which case such a conductor track only consists of the two conductor track sections which issue from the integrated circuit configuration and which are connected to one another in an electrically conductive manner in their area which is remote from the integrated circuit configuration, as a result of which a separate connecting conductor track section can be dispensed with.

In the integrated circuits 6 shown in FIGS. 1 and 2 the signal generator 57 is adapted to generate a signal BR1 representative of a given bit string. However, this is not necessarily so because such a signal generator may alternatively be adapted to supply an analog signal having at least one parameter that should be within a given range.

What is claimed is:

1. A method of fabricating integrated circuits (2, 3, 4, 5, 6, 7, 8, 9, 10), in which a reticular pattern (11) of separation strips (12, 13, 14, 15) on the semiconductor wafer (1) is defined, and in which a plurality of juxtaposed integrated circuit configurations (16) are formed between the separation strips (12, 13, 14, 15) on the semiconductor wafer (1), and in which during the fabrication of the integrated circuits (2, 3, 4, 5, 6, 7, 8, 9, 10) at least one conductor track (33, 37; 65) required for test purposes is formed for each integrated circuit (2, 3, 4, 5, 6, 7, 8, 9, 10), which conductor track (33, 37; 65) has two conductor track sections (34, 35, 38, 39; 66, 67), which two conductor track sections (34, 35, 38, 39; 66, 67) issue from the relevant integrated circuit configuration (16) and each extend at least into a separation strip (15, 14; 12, 15) and are connected to one another in an electrically conductive manner in the areas of their ends which are remote from the integrated circuit configuration (16), and which conductor track (33, 37; 65) serves for the application of a useful signal utilized for test purposes, and in which during the fabrication of the integrated circuits (2, 3, 4, 5, 6, 7, 8, 9, 10) for each integrated circuit (2, 3, 4, 5, 6, 7, 8, 9, 10) at least one additional conductor track section (41, 42; 71) is formed adjacent a conductor track section (34, 35, 38, 39; 66, 67), which additional conductor track section issues from the relevant integrated circuit configuration (16) and extends toward a separation strip (15, 14; 15) and serves for applying a spurious signal (BR2) which interferes with testing, and in which after the fabrication of the integrated circuits (2, 3, 4, 5, 6, 7, 8, 9, 10) on the semiconductor wafer (1) the semiconductor wafer (1) is partitioned into semiconductor dice (43, 44, 45, 46, 47, 48, 49, 50, 51) along the separation strips (12, 13, 14, 15), during which the conductor tracks (33, 37; 65) are severed.

2. Method as claimed in claim 1, in which at least one additional conductor track section (41; 71) is formed, which extends at least into a separation strip (55; 55) and which is cut off when the semiconductor wafer (1) is separated into the semiconductor dice (43, 44, 45, 46, 47, 48, 49, 50, 51).

3. A method as claimed in claim 1, in which only one additional conductor track section (41, 42; 71) is formed between the two conductor track sections (34, 35, 38, 39; 66, 67).

* * * * *